(12) United States Patent
Ni

(10) Patent No.: US 10,586,820 B2
(45) Date of Patent: Mar. 10, 2020

(54) OPTICAL SENSOR

(71) Applicant: NEW IMAGING TECHNOLOGIES, Verrieres le Buisson (FR)

(72) Inventor: Yang Ni, Palaiseau (FR)

(73) Assignee: NEW IMAGING TECHNOLOGIES, Verrières le Buisson (FR)

( * ) Notice: Subject to any disclaimer, the term of this patent is extended or adjusted under 35 U.S.C. 154(b) by 178 days.

(21) Appl. No.: 15/579,255

(22) PCT Filed: May 31, 2016

(86) PCT No.: PCT/EP2016/062258
§ 371 (c)(1),
(2) Date: Dec. 4, 2017

(87) PCT Pub. No.: WO2016/193258
PCT Pub. Date: Dec. 8, 2016

(65) Prior Publication Data
US 2018/0158855 A1 Jun. 7, 2018

(30) Foreign Application Priority Data
Jun. 4, 2015 (FR) ..................................... 15 55082

(51) Int. Cl.
*H01L 27/146* (2006.01)
*H04N 5/355* (2011.01)
(52) U.S. Cl.
CPC .... *H01L 27/14612* (2013.01); *H01L 27/1464* (2013.01); *H01L 27/14623* (2013.01);
(Continued)

(58) Field of Classification Search
CPC ........ H01L 27/14612; H01L 27/14681; H04N 5/35509; H04N 5/35518
See application file for complete search history.

(56) References Cited

U.S. PATENT DOCUMENTS 6,043,479 A * 3/2000 Chiang ............. H01L 27/14609
250/208.1
2002/0018132 A1 2/2002 Watanabe
(Continued)

FOREIGN PATENT DOCUMENTS

DE 101 23 819 A1 1/2002
EP 1 265 291 A1 12/2002
(Continued)

OTHER PUBLICATIONS

International Search Report for corresponding International Application No. PCT/EP2016/062258 dated Oct. 28, 2016.
(Continued)

*Primary Examiner* — Thanh Luu
(74) *Attorney, Agent, or Firm* — Pearne & Gordon LLP

(57) ABSTRACT

The present application concerns an optical sensor that includes one or more charge transfer pixels (10) each including a buried photodiode (11) generating a photoelectric charge when illuminated, a conversion element (12) receiving at least a portion of the photoelectric charge and tending to impose, on the photodiode, a potential satisfying a non-linear relationship with the intensity of generation of the photoelectric charge, and a charge transfer element (14) for reading the charge stored by the photodiode (11) such that the residual charge in same is zero after the reading by transfer.

17 Claims, 16 Drawing Sheets

(52) U.S. Cl.
CPC .. *H01L 27/14641* (2013.01); *H01L 27/14643* (2013.01); *H01L 27/14681* (2013.01); *H04N 5/35518* (2013.01)

(56) References Cited

U.S. PATENT DOCUMENTS

| | | |
|---|---|---|
| 2002/0024058 A1 | 2/2002 | Marshall et al. |
| 2004/0196398 A1* | 10/2004 | Doering ............ H01L 27/14609 348/308 |
| 2005/0001248 A1 | 1/2005 | Rhodes |
| 2006/0249766 A1 | 11/2006 | Rhodes |
| 2006/0249767 A1 | 11/2006 | Rhodes |
| 2006/0255382 A1 | 11/2006 | Rhodes |
| 2008/0188029 A1 | 8/2008 | Rhodes |
| 2009/0066793 A1* | 3/2009 | Takeda ................. H04N 17/002 348/148 |
| 2011/0025898 A1 | 2/2011 | Ni |
| 2014/0192035 A1 | 7/2014 | Tai et al. |
| 2015/0207470 A1 | 7/2015 | Ni |
| 2015/0281621 A1 | 10/2015 | Ni |
| 2016/0112662 A1* | 4/2016 | Guillon ................ H04N 5/3698 348/294 |
| 2017/0118429 A1 | 4/2017 | Ni |

FOREIGN PATENT DOCUMENTS

| | | |
|---|---|---|
| FR | 2 884 051 A1 | 10/2006 |
| FR | 2 920 590 A1 | 3/2009 |
| WO | 2013/088005 A1 | 6/2013 |
| WO | 2014/064274 A1 | 5/2014 |
| WO | 2015/189363 A1 | 12/2015 |

OTHER PUBLICATIONS

Written Opinion for corresponding International Application No. PCT/EP2016/062258 dated Oct. 28, 2016.
French Search Report for corresponding French Application No. FR 15555082 dated Mar. 29, 2016.

* cited by examiner

First read-out (reset level)   Second read-out (signal level)

OPTICAL SENSOR

The present invention relates to an optical sensor including one or more charge-transfer pixels in CMOS technology each including a photodiode generating a photoelectric current under illumination.

At the present time, this type of pixel includes, as illustrated in FIG. 1, a buried photodiode PD that collects electric charge induced by the incident light radiation and a transfer transistor TX for reading the charge thus collected. The transfer transistor has one of its terminals that makes contact with the photodiode and allows the charge collected by the photodiode to be transferred to another reception device such as a capacitive node FD, either for read-out or to be stored therein. The buried photodiode is typically composed of an N-doped well in a P-type substrate, covered with a thin doped layer on its surface (also called the "pinning layer"), also of P-type and often of high concentration, so that the space charge region ZCE does not make contact with the surface of the silicon where defects of all kinds are concentrated.

FIG. 2 shows the commonly accepted structure of what is called a "4 transistor" or 4T pixel. The transfer transistor TX is connected to a capacitive node formed from a floating diffusion FD. Before the transfer transistor is activated, the capacitive node FD is pre-charged to an initial voltage via a reset transistor RST controlled by a square-wave voltage pulse VRST. A first read-out of the voltage of the capacitive node FD is performed by virtue of the signal COL after this reset operation. A second read-out is performed after the activation by the signal TX of the transfer transistor TX. The difference between these two read-outs is representative of the amount of charge transferred from the buried photodiode to the capacitive node FD. This differential read-out allows noise induced by the action of the reset transistor RST on the capacitive node, called KTC noise, to be eliminated. A signal SEL is applied to a selection transistor SEL during the read-out.

It is desirable in such a known structure to ensure complete charge transfer from the buried photodiode to the capacitive node FD, so that, after the activation of the transfer transistor TX, there is zero mobile charge in the doped region of the buried photodiode. Specifically, if the mobile charge is not completely transferred to the capacitive node FD, additional noise proportional to the square root of the charge transferred from the buried photodiode is observed. The residual charge in the photodiode leads to a streak in the following image.

Complete charge transfer depends on two basic conditions:

1) the bias voltage of the cathode of the buried photodiode to which all the mobile electrons are flushed, also called the "pinning voltage" or Vpin, and 2) the pre-charge voltage and capacitance of the floating diffusion.

Thus it is necessary for the voltage of the capacitive node FD, after the charge has been received from the buried photodiode by the action of the transfer transistor TX, to remain higher than the voltage Vpin.

In a conventional design in which the pixel has a linear response, the voltage Vpin is generally set between 0.5 V and 1 V by construction.

FIG. 3 illustrates a result of a TCAD simulation with a buried photodiode having a voltage Vpin equal to 1 V, and it is possible to observe that the depletion region occupies all the cathode when the bias voltage reaches this value.

By approximation, it is possible to consider that the mobile charge stored, in the form of free electrons in the case considered, in the buried photodiode is proportional to the difference between the voltage on the photodiode $V_{PD}$ and the voltage Vpin. When the voltage on the photodiode becomes equal to the voltage Vpin, the mobile charge is zero.

Approximately, the charge stored in the photodiode $Q_{PD}$ is proportional to (Vpin–$V_{PD}$) and:

$$Q_{PD}=C_{PD}(V_{PD}-V\text{pin})$$

The reset voltage of the capacitive node FD is in general set between 2 V and 3 V and the usable voltage variation is thus about 1 V. The capacitance of the capacitive node FD sets in this case the maximum amount of charge that the capacitive node FD may receive. For example, for a capacitance of 1 fF, the reception capacity is 1 fC, equivalent to 6250 electrons. If this capacitance is increased to 10 fF, then this capacity increases to 62500 electrons. This capacity is referred to as full well capacity (FWC). On account of shot noise, the best signal-to-noise ratio obtained at FWC is equal to the square root of FWC. For example, it is 79 for FWC=6250 and 250 for FWC=62500. For a better image quality, it is preferable to have a high FWC value. However, capacitance cannot be increased without negative consequences on certain characteristics of the pixel, such as explained below.

The voltage induced by one electron on the capacitive node FD is defined as being the conversion gain. For example, for a capacitance of the capacitive node FD of 1 fF, a conversion gain of 160 µV/e is obtained. This gain drops to 16 µV/e when the capacitance is increased to 10 fF. The read transistor within the pixel and the read circuit generate read noise, the impact of which is inversely proportional to the conversion gain. For example, for a read noise of 320 µV, a conversion gain of 160 µV/e gives a noise equivalent to 2 electrons, but a conversion gain of 16 µV/e gives a noise of 20 electrons.

The ratio between the FWC capacity and the read noise defines the dynamic range (DR). For example, for a capacitance of the capacitive node FD of 1 fF, DR=6250/2 i.e. 70 dB. For a capacitance of the capacitive node FD of 10 fF the dynamic range TR is also equal to 70 dB, but the detection threshold for a capacitance of the node FD equal to 1 fF is much better (2 electrons) than for a capacitance of the node FD equal to 10 fF (20 electrons).

Therefore, it is difficult to obtain a very high dynamic range and a good sensitivity with the conventional pixel technology such as described above. However, for many applications such as motor-vehicle vision or surveillance, a dynamic range higher than 120 dB is desirable. For a 4T pixel with a linear response, a FWC capacity $10^6$ times higher than the equivalent dark noise in electrons would be necessary. Assuming that an FD-node capacitance of 10 fF is used with a read noise of 320 µV, the FWC capacity would have to be at least $20\times10^6$ electrons, and would generate a voltage variation of 640 V, this being almost impossible to achieve.

Moreover, it is known that a non-linear response allows both a good sensitivity and a wide operating range to be obtained. The logarithmic response of the human eye is one of the best examples thereof. As illustrated in FIG. 4, this logarithmic response possesses a very high initial slope when the excitation signal is low, and therefore a good sensitivity, and a slope that gradually flattens when the excitation signal increases in intensity, and therefore a very high operating dynamic range.

Existing what are called "logarithmic" pixel technologies are on the whole classed into two families: (1) Association between a photodiode generating a linear photocurrent and a non-linear current-voltage conversion element and (2) direct read-out of the voltage from a photodiode in solar-cell mode.

The first family is based on the association of a reverse-biased photodiode producing a photoelectric current proportional to the light intensity and a non-linear conversion component, consisting of a MOS transistor under the threshold for operation.

The second, which is the result of research of the applicant, is based on the use of an unbiased photodiode, the voltage generated by the photodiode then naturally being a logarithm of the light intensity as in a solar cell.

Solutions issued from these technological families all use the "voltage" mode, i.e. the useful signal consists of a voltage generated by the photodiode. With such a voltage operating mode, the quality of the signal is marred by thermal noise and in the case of the second family, also by the reset noise. The performance at low incident light levels is thus not good enough for certain applications.

Patent application WO 2014/064274 describes a combination of two pixels, one linear, the photodiode of which is in integration mode, and the other logarithmic, in which the photodiode is in photovoltaic mode. Because of the use of two types of photodiodes, such a structure is relatively complex and takes up a lot of space.

The applicant has tried internally to make the solar-cell-mode photodiode work within a 4T pixel. This proposition attempts to decrease KTC noise via a correlated double sampling (CDS) by virtue of a charge transfer. However, solar-cell-mode operation requires a voltage $V_{pin}$ very close to zero, or even slightly negative, this increasing the difficulty of production and decreasing collection efficiency because of the low electric field in the junction of the photodiode.

Patent application EP 1 265 291 relates to a CMOS image sensor in which each pixel comprises at least one MOS transistor connected in series via its drain or its source to the cathode of a photodiode, and this transistor is configured so that it operates at least partially in low inversion. Thus, in low inversion, for a relatively low exposure level, the response of the pixel is linear. Beyond this level of illumination, the response of the pixel then becomes logarithmic. A sampling-blocking transistor allows the electric charge generated by the photodiode to be read.

After this charge has been read, a residual charge may remain in the photodiode, generating noise in the following image.

In patent applications FR 2 920 590, US 2002/024058 and DE 101 23 819, voltage is read from the cathode of the photodiode, the latter being connected to the gate of a follower transistor.

All these solutions in addition suffer from a variation in the photoelectric response as a function of operating temperature. For applications such as surveillance or motor-vehicle vision, this variation in the response as a function of temperature is unacceptable because it may hinder the reproduction of colors.

The present invention thus aims to remedy all or some of the drawbacks of existing pixel structures and to provide a pixel structure having a non-linear response allowing both a good sensitivity and a high dynamic range, in a wide temperature range.

The invention achieves this objective by virtue of an optical sensor that includes one or more charge-transfer pixels each including a photodiode generating a photoelectric charge under illumination, a conversion element receiving at least some of this photoelectric charge and tending to impress on the photodiode a potential respecting a non-linear relationship with the intensity generating the photoelectric charge, and a charge-transfer element for reading the charge stored in the photodiode.

The photoelectric charge that forms within the photodiode may be partially removed via the conversion element, so that the amount of photoelectric charge that actually accumulates within the photodiode, following the arrival of photons, may follow a non-linear progression, at least from a certain level of accumulated charge. Preferably, the non-linear relationship corresponds to a linear progression at low light levels then to a logarithmic progression at higher light levels. The response is obtained by accumulating photoelectrons during the exposure time; the linear initial section of the response allows a good collection of photoelectrons in order to improve sensitivity at low light levels. Next, the response gradually passes into the logarithmic regime by virtue of the conversion element according to the invention, which generates a greater leakage of these electrons out of the photodiode. This logarithmic-response section allows the signal to be compressed and a wider operating dynamic range to be created.

The conversion element preferably has a non-linear conductivity dependent on at least one control signal that is applied thereto. The conversion element may be a MOS transistor, the one or more control signals being applied to the gate and/or to the drain of the transistor. As a variant, the conversion element is a bipolar transistor.

Preferably, the conversion element is a virtual base or gate transistor, the potential of which is set to that of the substrate by construction. In this case, the control signal may be the collector or drain voltage.

The charge-transfer element may include drain-induced-barrier-lowering (DIBL) means. This barrier lowering may be achieved by acting on the collector or drain voltage. When the conversion element is a bipolar transistor, the latter may be of lateral-BJT or vertical-BJT type, preferably with the emitter formed by the doped region corresponding to the cathode of the photodiode and the base corresponding to the anode substrate of the photodiode.

The DIBL effect corresponds to the extraction of electrons from the source by the electric field induced by the drain. When the drain voltage is high, electrons exit more easily from the source. These electrons are then captured by the drain, giving rise to the drain/source current. Thus, the drain/source current is controlled both by the source voltage and by the drain voltage. The photoelectric current passes through the source and it is converted into a non-linear voltage on the source. This conversion is also controlled by the drain voltage, which is considered to be a control voltage.

When the non-linear conversion is regulated by the DIBL effect, the non-linear conversion occurs with the current-voltage relationship between the drain and source or between the emitter and collector, the gate or base playing no role. In this case, the potential of the channel between the drain and source or between the emitter and collector is set by construction to that of the substrate, i.e. the gate or base is virtual. The notions of virtual-gate MOS transistor or virtual-base BJP transistor thus tend to amount to the same thing. For this reason, in the following text, a distinction is not always made between the two.

Preferably, said at least one control signal is dependent on temperature. The invention then allows the variation in the response of the sensor as a function of temperature to be compensated for by controlling, depending on temperature, the electrical properties of the conversion element, in particular its electrical conductivity.

The sensor advantageously includes at least one reference pixel having the same structure as the one or more illuminated pixels, but protected from the incident light and receiving an injection of charge simulating an illumination condition and the generation of the photoelectric charge by the photodiode.

The control signal may be automatically controlled depending on a signal output from the reference pixel or a group of reference pixels in order to maintain the output signal of the reference pixel or of this group of reference pixels at a constant value when the temperature varies. The same control signal thus determined may be sent to all the pixels of the sensor. It is thus possible to compensate for the influence of temperature on the response of the active pixels via such a feedback loop.

The control signal may be dependent on the nature of the illumination, for example flash lighting or unpulsed lighting, because it allows, via the conversion element, the photoelectric-charge-forming intensity from which the progression of the voltage of the photodiode passes from linear to non-linear to be controlled.

In particular, if the sensor is required to be able to suitably react to a flash of light and the pixels are not all read simultaneously, it may be advantageous for the signal resulting from integration over the exposure time to be preponderant. It is possible, by acting on the control signal, to shift the linear-to-non-linear transition of the voltage progression so as to obtain the widest possible linear progression range.

The control signal may thus be different depending on whether the light corresponds to an image taken with a flash, or an image taken with natural light.

The photodiode is preferably buried. Preferably, the pixel is produced such that the residual charge is zero after the read-out by transfer.

The conversion element may be a transistor formed by a doped region making up the drain, preferably with a doped confinement well under this drain region and a doped surface layer (pinning layer) of the photodiode extending over the surface of the substrate in the direction of the drain region, without however covering all the channel.

The control signal may be applied to the drain of the conversion transistor, the drain of the transistor being formed by a doped buried well extending to a depth larger than or equal to that of the read transistor of the pixel, in particular the selection transistor SEL. This arrangement reinforces the DIBL effect and facilitates the control of the conversion element with the drain voltage.

The conversion transistor may include a buried collector or drain extending, within the substrate, under the photodiode. This buried collector or drain may be common to a plurality of pixels of the sensor, or even to all of the pixels, all the drains being merged into a single layer. This simplifies the fabrication of the sensor. The photodiode above the buried drain may also be considered to form the emitter of a bipolar transistor.

In variant embodiments, the photodiode is illuminated via the back side of the substrate. The doped region corresponding to the cathode of the photodiode may extend below the doped region corresponding to the drain of the transistor. The doped surface region of the photodiode may extend beyond the doped region corresponding to the cathode of the photodiode.

The charge-transfer element may be an MOS transistor or a bipolar transistor exploiting an extreme DIBL effect referred to as punch through (or PT), with a sufficiently high voltage on the drain to tear electrons from the source (doped region of the photodiode). The charge-transfer element may include a transfer channel triggered by DIBL.

Yet another subject of the invention, according to another of its aspects, is a method for compensating for the temperature of a sensor according to the invention, wherein said at least one aforementioned control signal is acted on in order to compensate for the influence of temperature on the leakage of photoelectric charge from the photodiode. Specifically, temperature modulates how easily electrons leak from the photodiode. If temperature increases, electrons leak more easily and the logarithmic response arrives earlier. In contrast, when temperature decreases, the logarithmic response arrives later. It is possible to act on the conversion element in order to compensate for this variation and to obtain a stable response. A feedback loop may be used, associated with one or more reference pixels, to maintain said at least one control signal at a level allowing compensation for the influence of temperature. The one or more reference pixels are preferably pixels that receive said at least one control signal but in which the illumination is simulated by injection of a current corresponding to a certain illumination level, this or these reference pixels being masked from the incident light. The modulation of the control of the conversion element tends to maintain the response of the one or more reference pixels unchanged. The same control as that applied to the reference pixel(s) is applied to the active pixels, which are exposed to light in order to form the image.

Other features and advantages of the present invention will become apparent on reading the following detailed description of nonlimiting examples of implementation thereof, and on examining the appended drawing, in which:

FIGS. 1 to 4, which were described above, illustrate the prior art;

Figure 31:
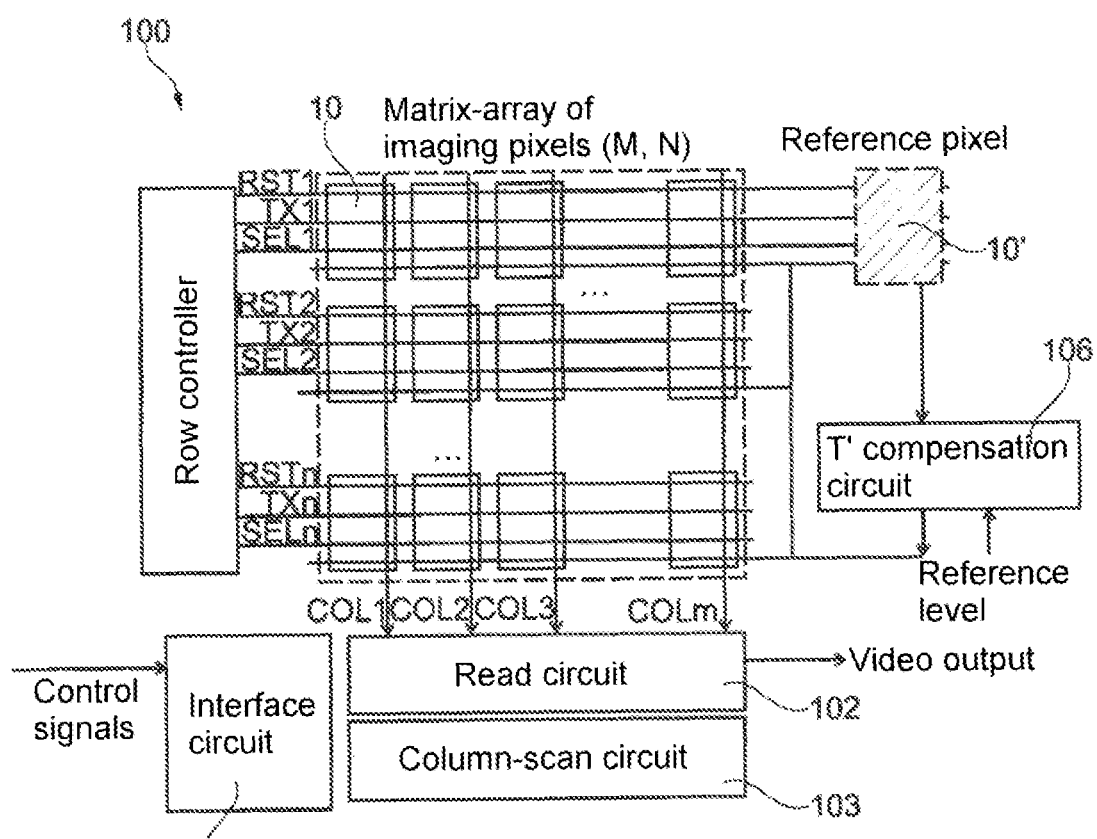
FIG. 31 shows an example optical sensor according to the invention.

FIG. 31 shows an example sensor 100 according to the invention. This sensor 100 includes, as is conventional, a matrix-array (N rows and M columns) of active pixels 10 and one or more reference pixels 10' protected from incident light. The one or more pixels 10' are identical to the active pixels 10, except for the fact that they are protected from incident light, and that a non-zero illumination level is simulated by injection of a current, as explained below.

The sensor 100 may include means allowing the pixels to be addressed, such as a row controller 101, and a read circuit 102 and a column-scan circuit 103, as is conventional, and an interface circuit 105. The row controller 101 generates control signals for each selected row. For each selected row, the timing diagram of FIG. 2 may be applied. The entire output of this selected row enters into the read circuit 102 in which the double readouts are processed. This circuit is controlled by the column-scan circuit allowing the pixels to be read. The read circuit may either be analogue, or digital and comprise an analogue-digital converter.

According to one advantageous aspect of the invention, the sensor may include a temperature-compensation circuit 106. The reference pixel or group of pixels 10' receives the same control signals and generates an output signal that is processed in the compensation circuit by comparison with a predefined reference level. This circuit generates a drive signal that is sent to all the pixels, including the one or more reference pixels, in order to compensate for the variation in the response of the pixel as a function of temperature, as will be explained in detail below.

For applications in which the variation in the pixel response as a function of temperature is tolerated, it is possible to remove this compensation circuit and the one or more reference pixels. In this case, a set electric signal is applied to the pixels in the matrix-array. One example of such a case is a sensor mounted on a temperature-regulated thermal electric cooler (TEC). This set control signal for example aims to preserve a linear progression in the response of the sensor at low light levels, depending on the targeted applications.

The invention is not limited to a particular number of pixels nor to pixels arranged in a matrix-array; the pixels may be reduced to one row; at the least, the sensor may include only a single active pixel.

Figure 5:
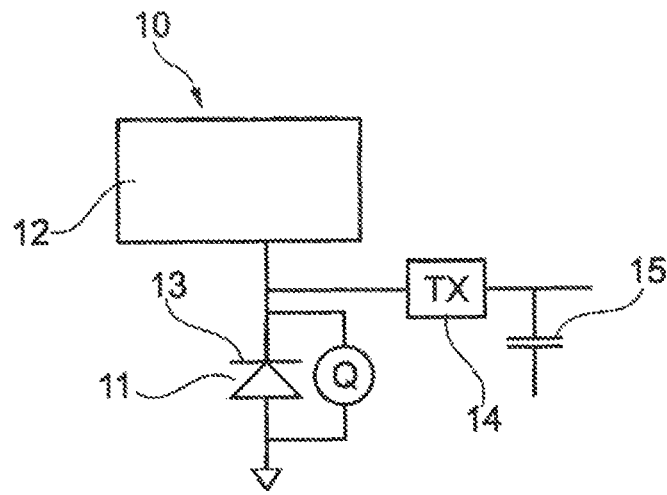
FIG. 5 is a circuit diagram of a pixel according to the invention.

FIG. 5 schematically shows an example pixel 10 of an optical sensor according to the invention.

This pixel 10 includes a photodiode 11, which is preferably buried, connected to a non-linear current-voltage conversion element 12 that preferably has a current-voltage relationship that is close to a logarithmic function, in particular under high light levels in order to generate a non-linear voltage on the cathode 13 of the photodiode. A charge-transfer device 14 for transferring charge to a reception device 15 for receiving the charge allows access to be gained to the charge stored in the photodiode, which is representative of the level of exposure to light of the photodiode.

The non-linear conversion element 12 may be controlled by an electrical signal originating from a control circuit (not shown in FIG. 5) such as produced by the aforementioned circuit 106, this electrical signal preferably being a function of temperature so as to compensate for its influence but possibly also as a variant resulting from intentional programming. This control circuit is preferably integrated into the same chip as the pixels.

Figure 6:
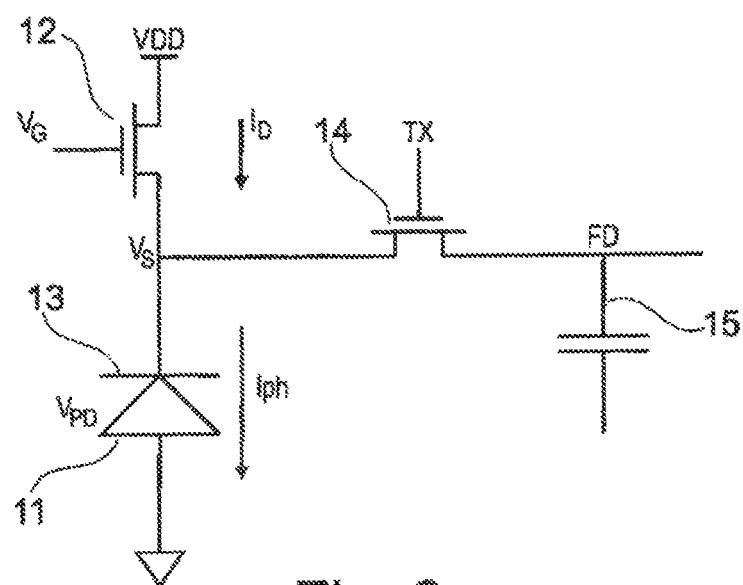
FIG. 6 illustrates the use of a CMOS transistor to produce the non-linear conversion element.

In one example implementation of the invention, which example is illustrated in FIG. 6, a MOS transistor forms the non-linear conversion element 12 and the charge-transfer device 14 for its part is also a MOS transistor.

In a pixel of common size ranging from a few microns to a few tens of microns, the photocurrent generated by the photodiode is very small. For example, a photodiode of 10 μm by 10 μm generates only about 10 nA with a direct illumination of 100 kLux.

At this level of current, the non-linear conversion transistor 12 operates in subthreshold mode. The drain current $I_D$ may then be expressed by the following equation:

$$I_D = I_0 e^{\frac{V_G}{\eta V_T}} \left(e^{-\frac{V_S}{V_T}} - e^{-\frac{V_D}{V_T}}\right) \quad (1)$$

In this equation, $V_G$ is the gate voltage of the conversion element, $V_S$ the source voltage, $V_D$ the drain voltage and $V_T$=kT/q, k being Boltzmann's constant, T absolute temperature and η a constant slightly higher than 1.

When a voltage Vd that is sufficiently high with respect to $V_T$ is applied, since 11 is close to 1, formula (1) may be simplified to:

$$I_D = I_0 e^{\frac{V_G - V_S}{V_T}} \quad (1')$$

Given that $V_S = V_{PD}$ and that $I_D = I_{ph} + I_{dark}$, where $I_D$ is the drain current of the conversion element, $I_{ph}$ the photocurrent and $I_{dark}$ the dark current, the voltage on the cathode of the photodiode is given by the relationship:

$$V_{PD} = V_S = V_G - V_T \log(I_{ph} + I_{dark}) + V_T \log I_O \quad (2)$$

Figure 7:
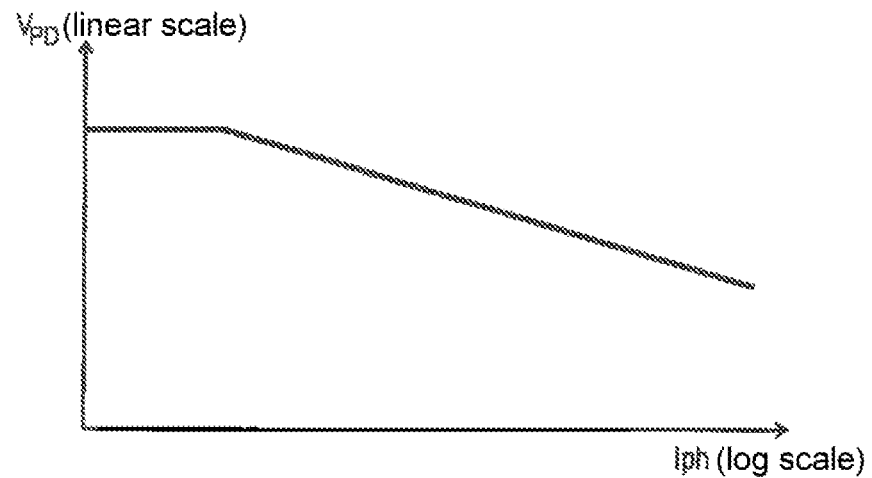
FIG. 7 shows the cathode voltage of the photodiode as a function of photoelectric current.

The photoelectric-charge-forming intensity corresponds to the photocurrent Iph. FIG. 7 is a graphical representation of the photodiode cathode voltage as a function of the photoelectric current Iph, which voltage is logarithmic, except at very low light levels. This decreasing voltage indicates that the number of freed electrons stored in the cathode of the photodiode increases as a function of light intensity, essentially logarithmically if the variation in the capacitance of the photodiode junction is ignored. This approximation is valid because the variation in the voltage is small because of the logarithmic compression obtained via the conversion transistor.

Figure 8:
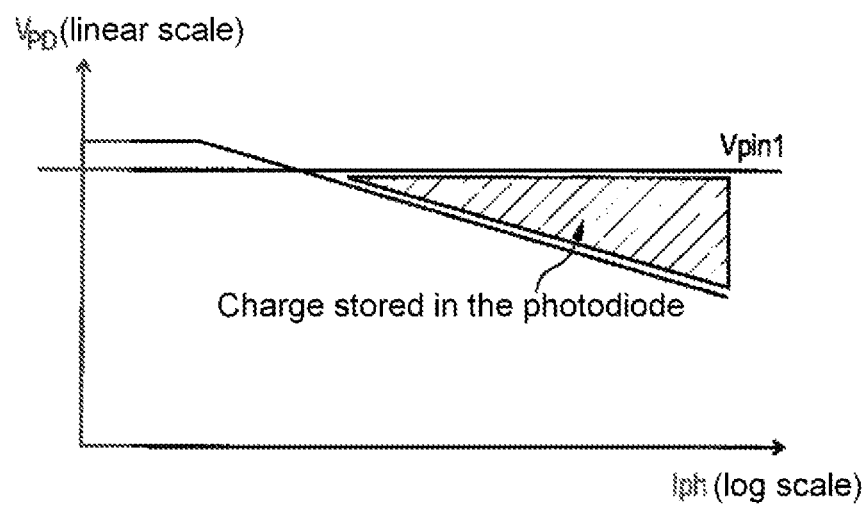
FIGS. 8 and 9 illustrate the charge stored in the photodiode corresponding to two different voltages Vpin.

When the photodiode is a buried photodiode, the cathode is completely depleted of electrons when the cathode voltage reaches the value Vpin. FIG. 8 illustrates the case where the voltage $V_{pin}$ is lower than the maximum possible voltage if the photodiode is not a buried photodiode. In this case, when the photocurrent is below a certain level and the voltage on the cathode reaches the value Vpin, there is no longer any charge stored in the photodiode. All the photo-electric charge is removed via the non-linear conversion transistor.

Figure 9:
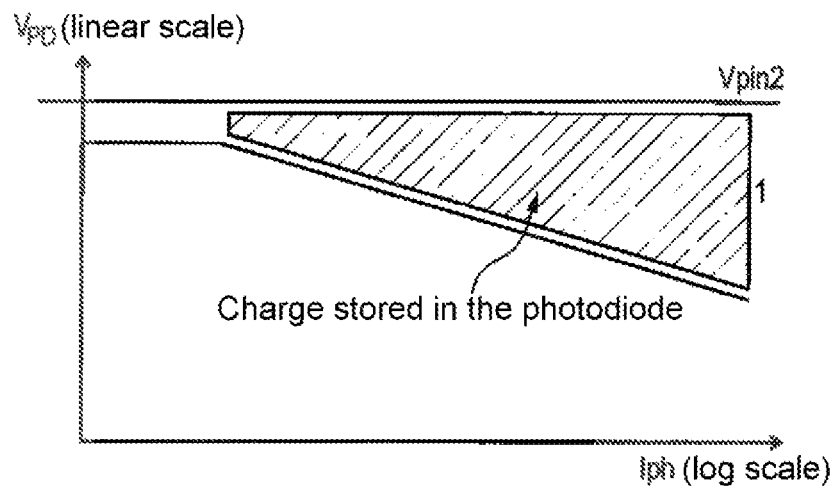

When the voltage $V_{pin}$ is higher than the maximum possible voltage on the source of the non-linear conversion transistor, as illustrated in FIG. 9, the cathode of the photodiode is charged to the voltage Vpin by the transfer transistor after a complete charge transfer. In this case, the source voltage of the transistor, which is also the voltage of the cathode of the photodiode, is also biased to a value $V_{pin}$. According to relationship (1') above, the current in the conversion transistor is almost 0. The excess current corresponding to $I_{ph}+I_{dark}$ creates an accumulation of charge in the photodiode at the start of its exposure to the light, after the complete transfer of its charge by the transfer transistor TX.

This accumulation is essentially linear until the photodiode voltage $V_{PD}$ touches the non-linear response curve set by the conversion transistor at which point practically all the photoelectric charge is removed by this conversion transistor. Afterwards, the variation in the amount of charge stored follows the logarithmic triangle as in the case of FIG. 8.

Figure 10:
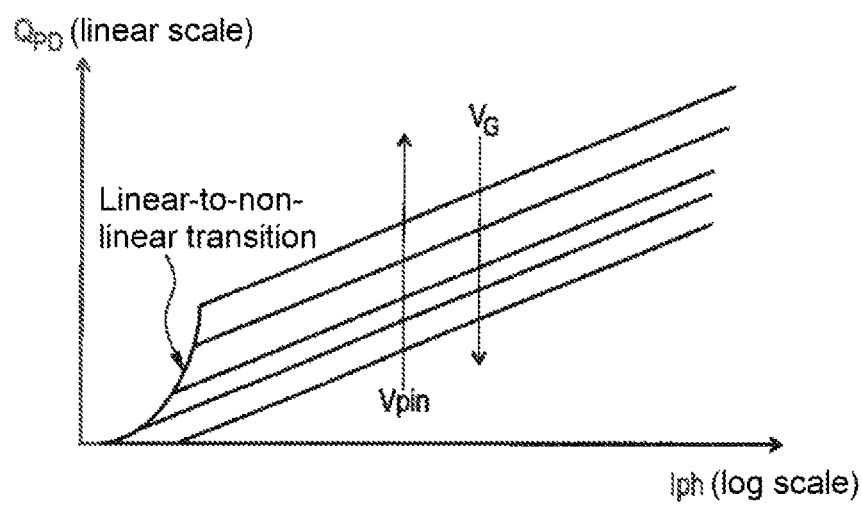
FIG. 10 illustrates the variation in the response of the charge $Q_{PD}$ of a pixel as a function of the variation in the gate voltage $V_G$ or the voltage Vpin.

If the amount of charge stored in the photodiode is plotted as a function of the variation in the voltage $V_{pin}$ and the voltage $V_G$, a family of curves such as illustrated in FIG. 10 is obtained. The maximum possible value of the cathode voltage $V_{PD}$ of the photodiode is dependent on the voltage $V_G$ on the gate of the conversion transistor according to relationship (3) above.

Since the voltage $V_{pin}$ is set by construction, the variation in the gate voltage $V_G$ of the conversion transistor causes a variation of the same nature as the variation in the voltage $V_{pin}$ but in an opposite direction. A higher $V_{pin}$ value or a lower $V_G$ value create an essentially linear initial response followed by a logarithmic response. It is preferable to create a non-linear response having a linear initial section because it allows all the photo-electric charge to be preserved at low light levels.

The charge-reception device may be a floating-diffusion node, as is known for a 4T pixel.

Before the charge of the photodiode is read out, the capacitive node FD is pre-charged to an initial voltage that is higher than the voltage Vpin of the photodiode. The transfer transistor TX is then actuated.

Some of the charge stored in the junction of the photodiode is transferred to the capacitive node FD via this transfer transistor TX. The voltage of the photodiode increases and that of the capacitive node FD decreases until equilibrium is reached. The variation in the voltage of the capacitive node FD provides information on the amount of charge transferred from the photodiode to the capacitive node FD. Preferably, the initial voltage of the capacitive node FD is high enough for the voltage on the photodiode to be able to reach the voltage $V_{pin}$ at the end of the transfer. In this case, the transfer is complete and the photodiode is completely emptied of mobile charge.

The voltage on the gate of the MOS conversion transistor may be chosen so that when the voltage $V_{pin}$ is reached, the current in the MOS conversion transistor is very low, and ideally generates less than one electron with the exposure time used. After a complete charge transfer has taken place, a new acquisition cycle may commence.

Figure 30:
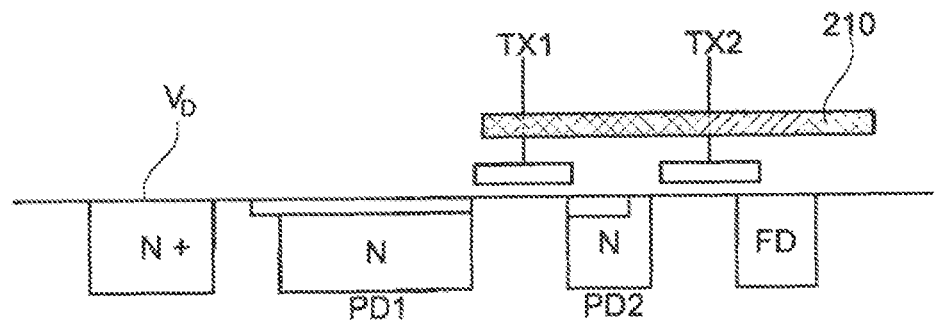
FIG. 30 illustrates that it is possible to produce a buffer structure in a pixel.

In one variant, as illustrated in FIG. 30, the charge-reception device is a buffer structure PD2 having the same structure as the buried photodiode PD1 and playing a role of charge memory, being protected from incident light by a mask 210. This buffer structure PD2 has a voltage $V_{pin}$ higher than that of the photodiode PD1, so as to allow charge to flow from the photodiode PD1 to the buffer structure PD2. It may be of smaller size than the photodiode from which it receives charge, because it does not have to generate photoelectric current. This configuration is useful for producing what is called a "snapshot" sensor, in which the respective charges of all the photodiodes are simultaneously transferred to the associated buffer structures, which are then read sequentially, thereby avoiding deformation of the image in the case of moving objects. Charge may be transferred from a buried photodiode PD1 to the associated buffer structure PD2 via a transfer element such as a MOS transistor for example, controlled by a signal TX1. The transfer of the charge from the buffer structure PD2 to a capacitive node FD with a view to readout thereof may be achieved using another transfer element such as another MOS transistor for example, controlled by a signal TX2. The signal TX1 is applied to all the transfer transistors controlling transfer to the buffer structures PD2, whereas the signal TX2 is applied sequentially.

The thermal dependence of the response of the pixel of the present invention, according to equation (2) above, is due to $V_T$, Io and $I_{dark}$.

$I_{dark}$ may be neglected because the dark current in a buried photodiode may be decreased to a very low value using a modern fabrication process. The dependence of $V_T$ on temperature is proportional to absolute temperature. It may be corrected quite easily with a gain correction such as conventionally encountered within a video camera.

Figure 11:
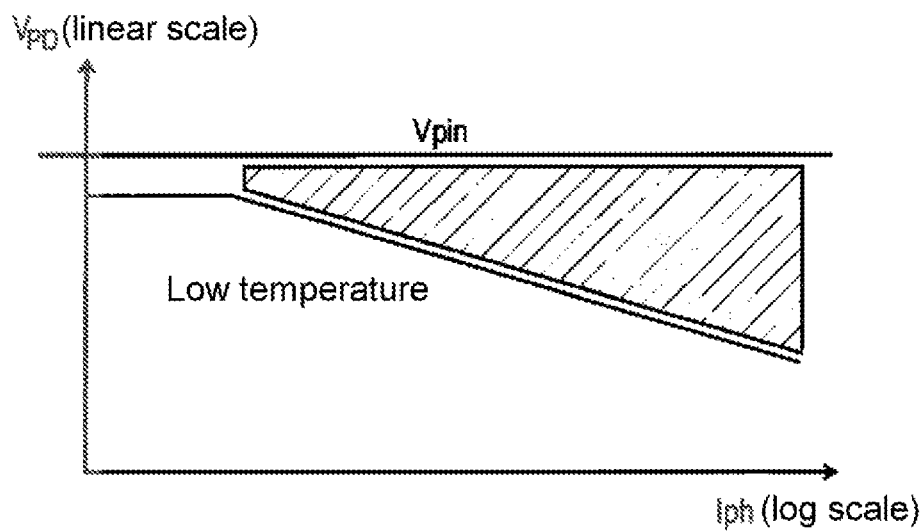
FIGS. 11 and 12 are analogous views to FIGS. 8 and 9, but corresponding to two different operating temperatures of the pixel.
Figure 12:
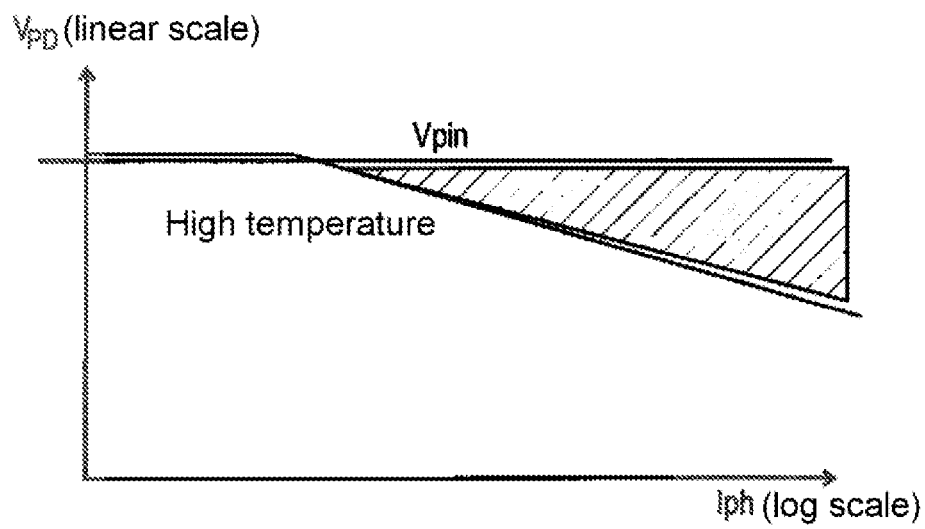
Figure 13:
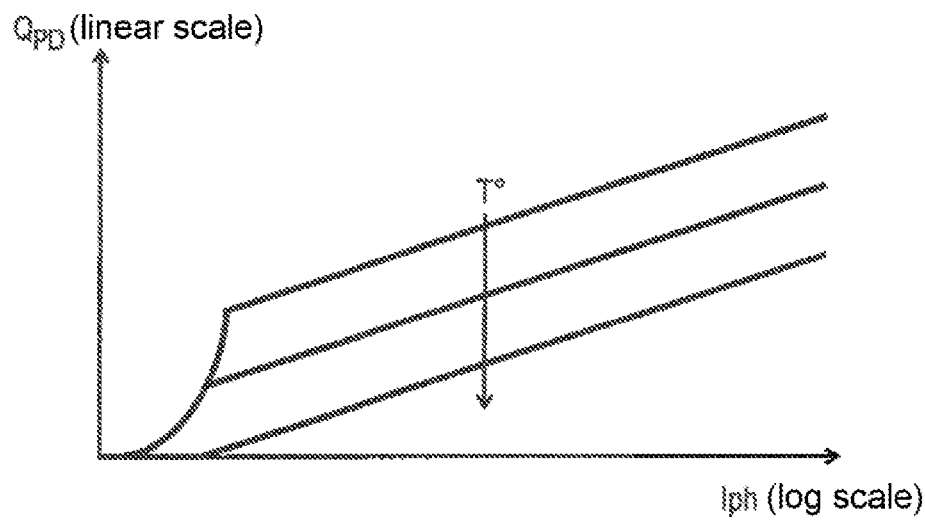
FIG. 13 illustrates the variation in the response of a pixel as a function of temperature.

The current Io of the conversion transistor is highly dependent on temperature because typically it doubles every 6-7° C. This variation deforms the response curve by changing the maximum possible voltage on the cathode of the photodiode, as FIGS. 11 and 12 show. The amount of charge stored in the photodiode is also impacted by temperature, as illustrated in FIG. 13 in which it may be seen that an increase in temperature decreases the amount of charge stored in the cathode of the photodiode. Lastly, although the voltage Vpin is set by construction by the physical structure of the photodiode, it also changes with the temperature T.

FIG. 10 shows that by modulating the gate voltage $V_G$ of the conversion transistor, it is possible to produce the same effect as the variation in the voltage Vpin, and the variation in the response with temperature, illustrated in FIG. 13, may thus be compensated for via a suitable modulation of the voltage $V_G$ as a function of temperature.

Figure 14:
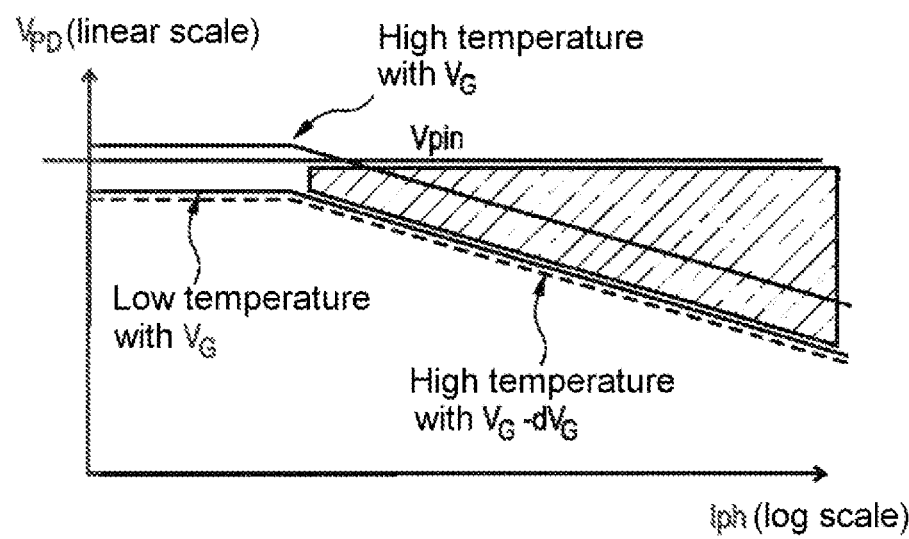
FIG. 14 illustrates the drop in the amount of charge stored as a function of gate voltage and as a function of illumination level, due to the effect of temperature.

FIG. 14 shows that by lowering the gate voltage $V_G$ to $V_G-dV_G$ when the temperature increases, it is possible to increase the initial charge storage capacity of the photodiode and thus obtain the same response curve.

From formula (3), it may be seen that a modulation of the gate voltage $V_G$ allows this variation to be compensated for if it is possible to keep the sum $V_G+V_T*\mathrm{Log}\ Io$ constant.

Figure 15:
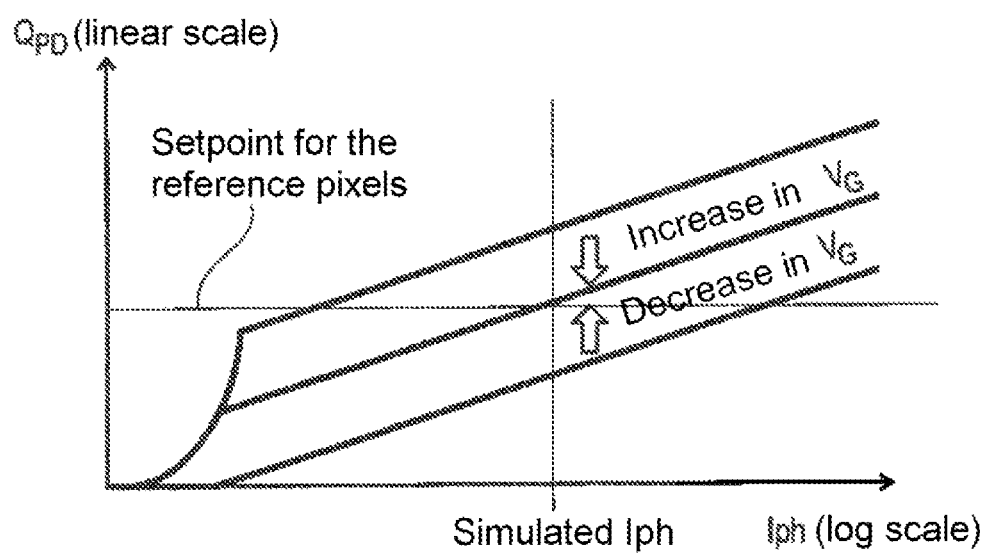
FIG. 15 illustrates the variation in the response of the sensor as a function of the gate voltage $V_G$.
Figure 16:
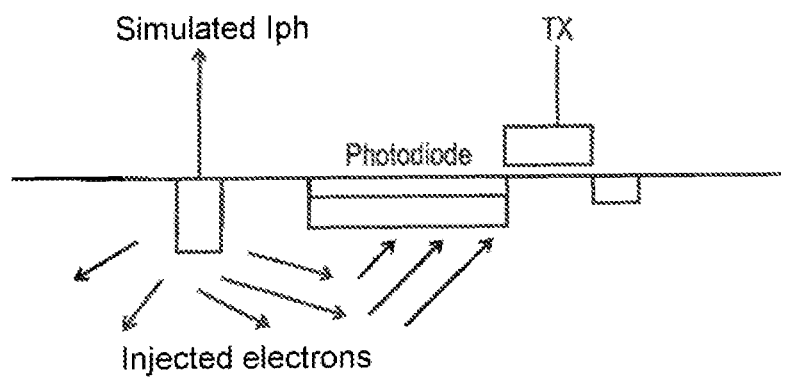
FIG. 16 illustrates the injection of a current into a reference pixel.

FIG. 15 illustrates one possible way of implementing a temperature compensation, using one or more reference pixels masked by a layer that is opaque to light, such as a layer of metal for example, like the one or more aforementioned pixels 10'. An electrical current is injected, as illustrated in FIG. 16, into the one or more photodiodes of these reference pixels, thereby simulating the photoelectric current. This current is sufficiently large that this or these reference pixels work in the logarithmic regime. This current may be injected into the photodiode of a reference pixel through an electrical resistor connected to a voltage source that generates a current in the same direction as the photo-electric current generated by the photodiode under the effect of its illumination. As a variant, this current may be injected into the photodiode of a reference pixel through a capacitor connected to a voltage ramp generator that generates a current in the same direction as the photoelectric current generated by the photodiode.

Thus, instead of creating a reference level corresponding to the dark level, a reference level corresponding to a certain illumination level is created by electrically simulating this illumination of the one or more reference pixels. Thus drawbacks related to the effect on the reference signal of parasitic light, which is relatively small at a high illumination level, is avoided. The injected current for example simulates an illumination level of at least 10000 lux.

Figure 17:
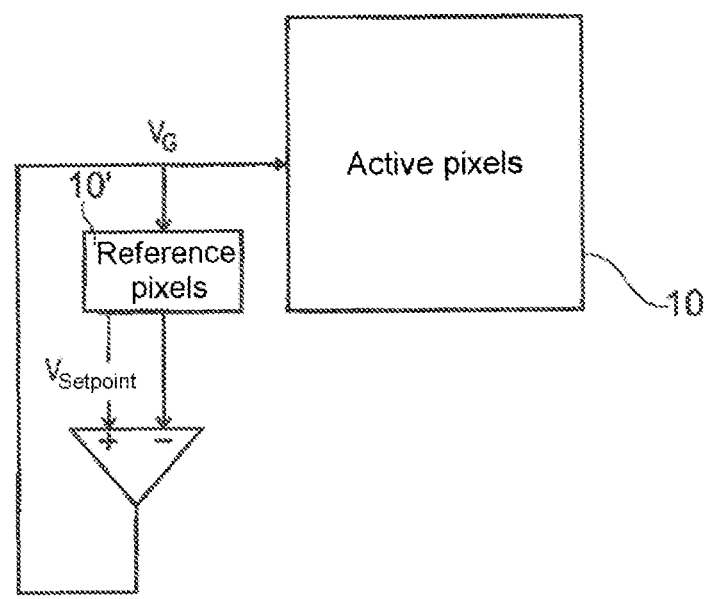
FIG. 17 shows an example of processing of signals generated by reference pixels of the sensor using a feedback loop.

Any temperature variation shifts the linear-logarithmic transition and has an impact on the response of this or these reference pixels. It is possible to adjust the gate voltage $V_G$ so that the response of this or these reference pixels is always at a predefined level, by virtue of a feedback loop such as illustrated in FIG. 17. This operation allows the dependence on temperature of the response of the pixels to be successfully eliminated. It may be seen in FIG. 17 that the pixels 10 and 10' receive the same control signal, on the conversion element, in the present case the same gate voltage $V_G$ in the illustrated example. This control signal is generated so as to maintain the signal generated by the reference pixels at a setpoint value $V_{setpoint}$. In the case of a plurality of reference pixels 10', the average value generated by these pixels may be used as output signal.

The one or more reference pixels 10' are preferably placed on the substrate of the sensor in order to obtain a temperature that is as close as possible to that of the active pixels. A plurality of reference pixels or groups of reference pixels may be placed in various locations on the sensor in order to correctly measure the temperature of the substrate. The average value of the reference pixels may be used to set the compensation.

The regulation may be achieved by analog means. As a variant, it is possible to use digital means including an ADC and a DAC associated with a processor.

In one variant, the compensation is achieved using a temperature probe that delivers the temperature to a circuit including a controller equipped with a memory in which is stored a look-up table that directly generates, for each temperature value, a corresponding value of the control signal, for example the gate voltage $V_G$ of the conversion transistor in the example just described with reference to FIG. 6. The look-up table may be obtained beforehand in a calibration phase.

In the case where temperature does not vary greatly during the use of the sensor or in the case where the temperature dependence is tolerated, it is possible to apply a set control voltage to the gate $V_G$ depending on the wanted non-linear response.

The one or more reference pixels are advantageously used to obtain a temperature compensation.

The conversion element may take multiple forms, of MOS or bipolar structure.

Figure 18:
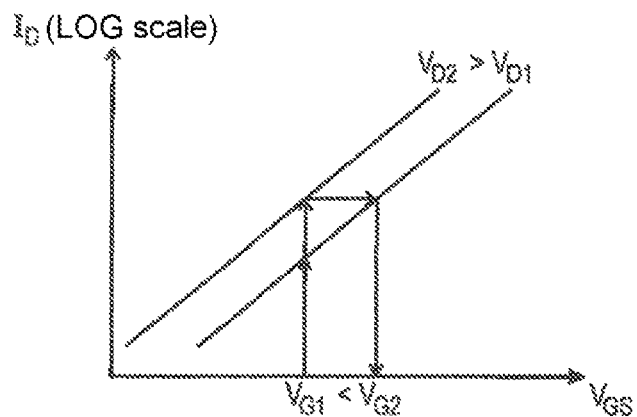
FIG. 18 illustrates the relationship between $I_D$ and $V_{GS}$ in the presence of the DIBL effect.

Advantageously, in particular when it is a question of a MOS transistor, the design of the conversion element takes advantage of the effect referred to as drain induced barrier lowering (DIBL), which may be quite pronounced in a short-channel MOS transistor. The same effect is also observed in a BJT transistor when the base is weakly doped, for example to lower than $10^{17}$ atoms per cm$^3$. This effect is an electrostatic influence of the drain on the source. A higher drain voltage makes it easier for electrons to exit from the source. As FIG. 18 shows, the increase in the drain voltage $V_D$ is equivalent to an increase in the gate voltage $V_G$ with the same drain voltage. In other words, the DIBL effect modulates the current Io in a sub-threshold MOS transistor. This modulation of the current Io may cancel out the temperature-related contribution and thus achieve a compensation of the response of a pixel according to the present invention.

In a standard CMOS fabrication process, the DIBL effect is minimized by special doped wells in the transistor structure. The chapter on the MOSFET structure of the book "Physics of Semiconductor Devices" by S. M. Sze published by John Wiley & Sons Inc. 1981 gives a quite detailed description on these optimizations. In the context of the present invention, it is preferable to preserve this effect sufficiently in order to be able to create a compensation of the current in the range of variation in temperature. One effective method for achieving this is to decrease the doping of the substrate under the gate. For example, it is possible to decrease the doping of the substrate under the gate to a level comprised between $10^{14}$ and $10^{17}$ atoms per cm$^3$ and to increase the depth of doping for the drain, for example to the same value (within 30%) as the length of the channel, without too greatly decreasing the channel length, the depth thus for example being comprised between 0.25 microns and 2 microns.

Figure 19:
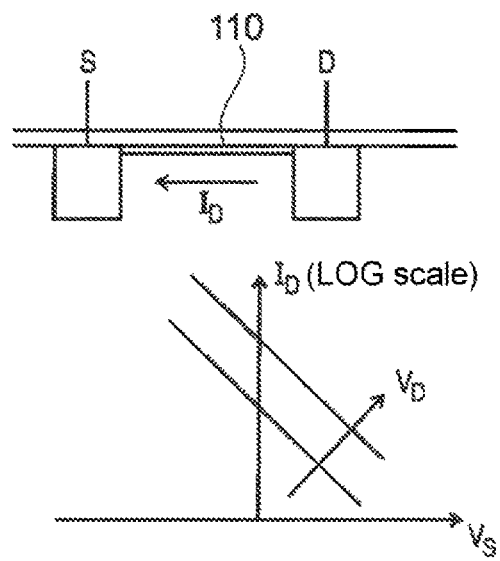
FIG. 19 illustrates modulation of the current $I_D$ and of the voltage $V_S$ via the DIBL effect.

The advantage of this approach exploiting the DIBL effect is that it makes it possible to place a set voltage on the gate and to create the compensation by modulating the drain voltage of the conversion transistor. In this case, it is possible to choose to use a voltage $V_G$ equal to 0 for the gate of the conversion transistor. A gate biased to 0 V is advantageously replaced by a thin layer 110 a surface region of which is highly P-doped, this layer making contact with the P substrate such as illustrated in FIG. 19, for a P-type substrate in which in the cathode of the photodiode consists of an N-doped well.

The virtual gate thus formed does not suffer from a dispersion in the threshold voltage induced by charge trapped in the oxide of the gate as in a conventional transistor. A sufficiently high dopant concentration is preferred, for example higher than $10^{17}$ atoms per cm$^3$ in order to make the surface Fermi level stable and also to eliminate surface leakage current. It is also possible to use a substrate without additional doping for this conversion transistor, i.e. what is called a native transistor. The doping is insured simply by uniform doping during the fabrication of the silicon wafer, the most common dopant concentration being $10^{15}$ atoms per cm$^3$.

The drain modulation voltage of the conversion transistor may be generated with the same methods as those proposed above for the compensation achieved by acting on the gate voltage $V_G$, here replaced by a modulation of the drain voltage $V_D$.

Figure 20:
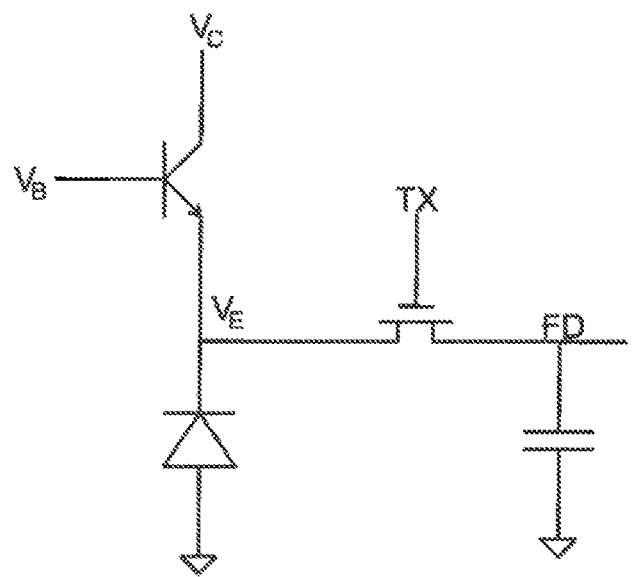
FIG. 20 illustrates the use of a bipolar transistor to produce the conversion element.

The non-linear conversion element may also be a bipolar transistor as illustrated in FIG. 20. In this case, the collector is equivalent to the drain, and the base to the gate and the emitter to the source of the MOS transistor described above. Formula (3) may be rewritten in the form:

$$V_{PD}=V_E=V_B-V_T \log(I_{ph}+I_{dark})+V_T \log I_O \qquad (4)$$

where $V_E$ is the emitter voltage and $V_B$ the base voltage.

The same compensation mechanism also applies thereto, and it is possible to act on the base voltage by way of control signal, or better still to achieve control via the collector voltage, as described below.

Figure 21:
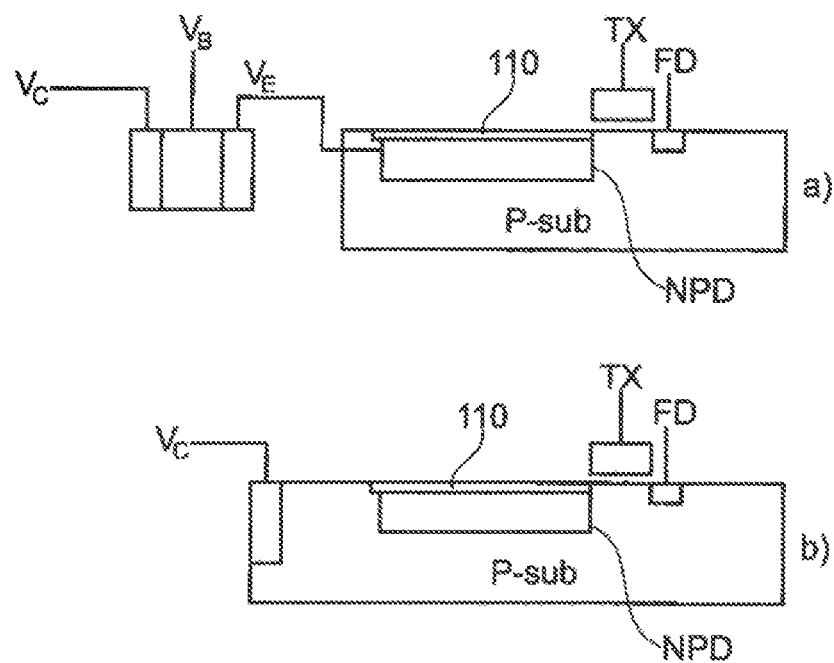
FIGS. 21 to 27 show examples of embodiments of pixel structures.

The structure illustrated in FIG. 21 a) is incompatible with a buried photodiode because it is necessary to create an explicit interconnection between the emitter and the cathode of the buried photodiode. To form a contact on the cathode requires a portion of the cathode to touch the surface of the silicon.

The preferred configuration with a buried photodiode is to connect the base to the substrate, which forms the anode of the buried photodiode, as illustrated in FIG. 21 b). In this case, modulation of the voltage of the collector alone allows a temperature compensation to be achieved.

As with a virtual gate, the doping concentration in the base region is advantageously low for two reasons. The first is that it is advantageous to have a relatively pronounced DIBL effect, for example of more than 50 mV/V (1V on the drain inducing a change in the threshold of 50 mV) for the temperature compensation. The second is that a quite high maximum photodiode cathode voltage is needed in order to be able to reach the voltage $V_{pin}$ of the buried photodiode. If this dopant concentration is not low, it is necessary to work with a voltage $V_{pin}$ that is very close to zero, or even negative, in order to ensure the initial response is a linear progression, allowing a good sensitivity at low light levels to be ensured.

It is advantageous to use a weakly doped substrate grown epitaxially without additional doping for the base of this transistor. The use of native doping in a substrate grown epitaxially also ensures a better dopant uniformity in a sensor making use of this type of pixel.

It will also be noted that the drain or the collector of the non-linear conversion transistor is biased to a high voltage, typically close to the supply voltage of the sensor. Therefore the collector or the drain diffusion also sucks up electrons created by the incident light. This competition decreases the quantum efficiency of the photodiode. A P-doped well may form an electrostatic screen repulsing some of these electrons toward the buried photodiode.

Figure 22:
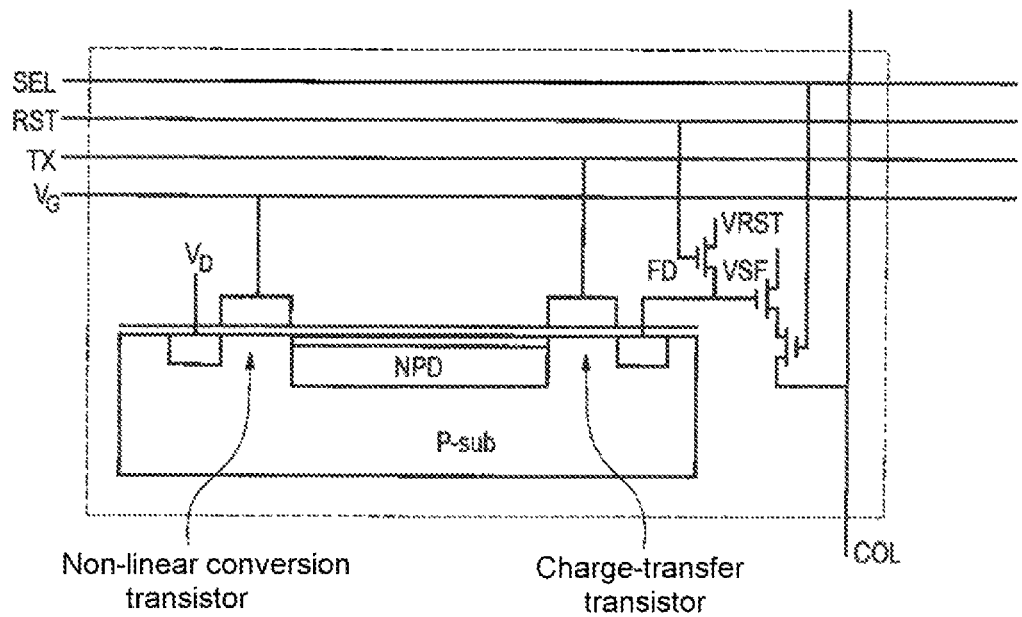

FIG. 22 shows an embodiment according to the invention with a conventional MOS conversion transistor. It is possible to use, as illustrated, a floating diffusion FD to receive and to measure the amount of charge stored in the buried photodiode, under illumination. The voltage-follower portion for the read-out of the voltage on the floating diffusion FD is shown schematically because it may easily be made with available conventional transistors in a conventional CMOS fabrication process.

Figure 23:
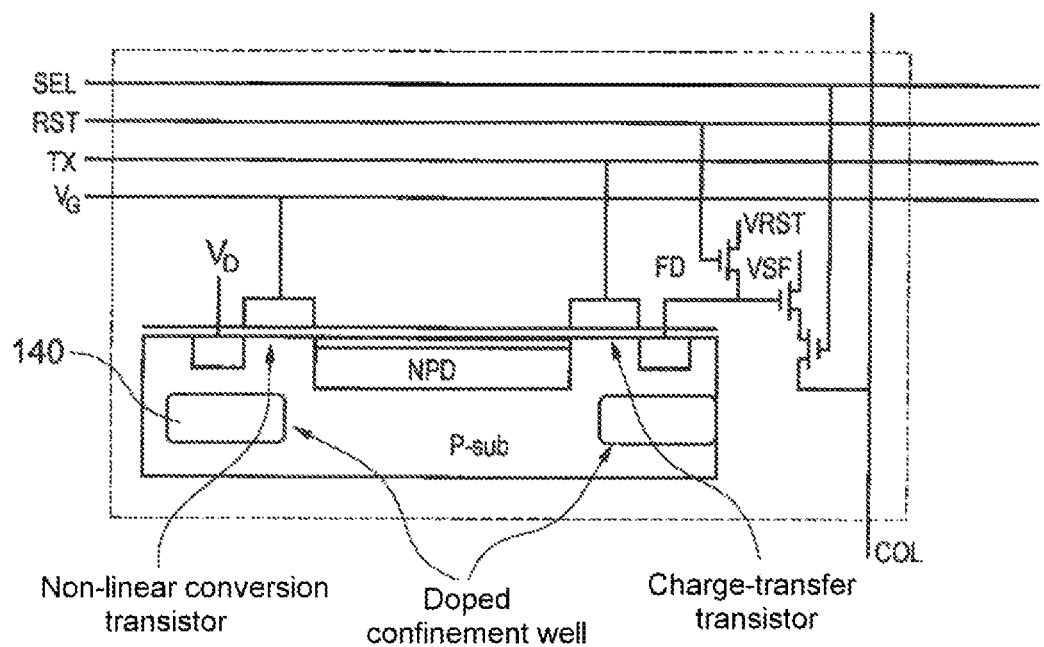

FIG. 23 illustrates a variant with a doped confinement well 140 under the doped drain region of the transfer transistor and under that of the conversion transistor. This doped confinement well is, in the described example, of $P^+$-type, and the substrate is of P-type. The doped confinement well lies at a depth larger than the doped region forming the cathode of the photodiode.

Figure 24:
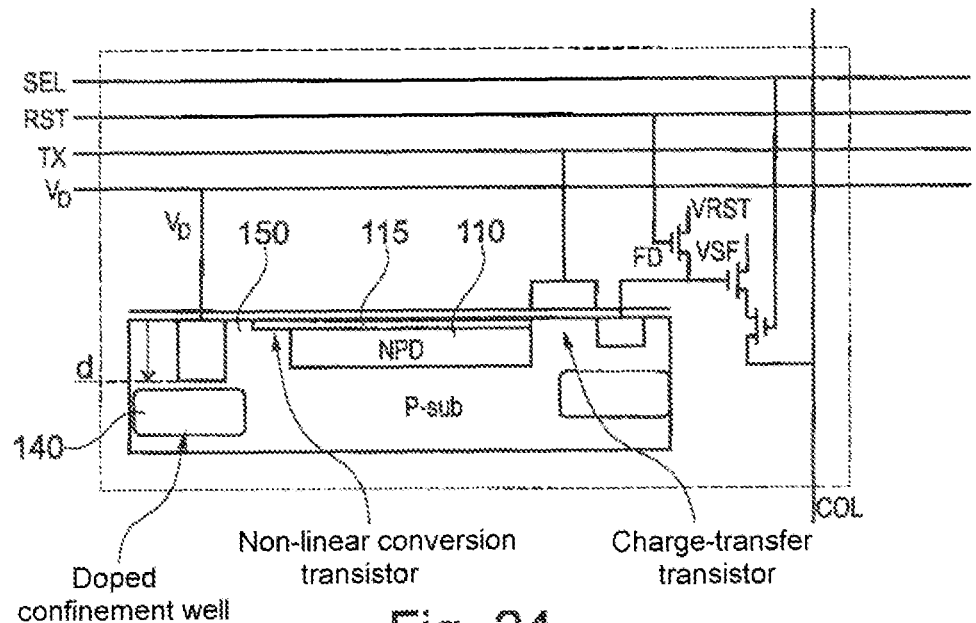

In the embodiment illustrated in FIG. 24, the control signal consists of the drain voltage of the conversion transistor. The gate is at the same potential as the substrate, and it is qualified a "virtual" gate. The doped surface region of the photodiode is extended by 115 beyond the doped region of the photodiode forming the cathode. This embodiment takes advantage of the DIBL effect in a conversion transistor the virtual gate of which is biased to zero. In order to accentuate the DIBL effect, the drain of the conversion transistor is doped to a depth d larger than that of the read transistors of the pixel, which are conventional transistors; in particular the selection transistor SEL is a conventional transistor. This depth may be at least equal to that of the region NPD of the buried photodiode, as illustrated. The $P^+$-doped virtual gate connects with the protective layer 110 of the buried photodiode.

The N-doped region NPD of the buried photodiode plays the role of the source of the conversion transistor. It is optionally possible to leave a gap 150 between the virtual gate and the drain in order to limit the leakage current due to the tunneling effect caused by their very high dopant dose.

A doped confinement zone is advantageously produced under the drain of the conversion transistor, and likewise under the transfer transistor.

Figure 25:
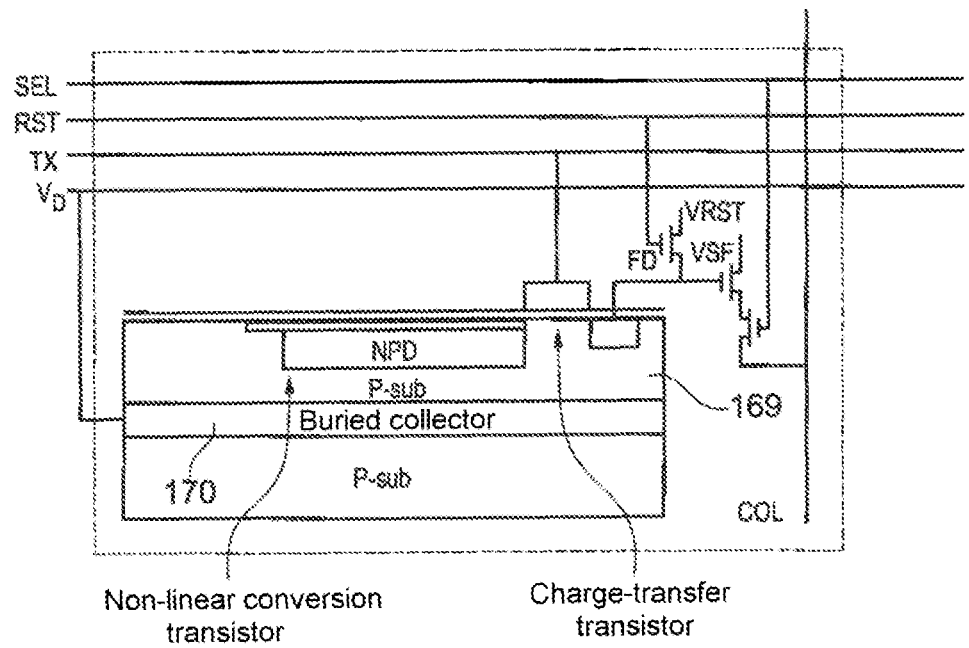

In the embodiment illustrated in FIG. 25, which is relatively compact, a bipolar transistor, the base of which is connected to the substrate 169, which forms the anode of the buried photodiode, plays the role of the non-linear conversion element. The collector 170 of the accentuated-DIBL-effect conversion transistor is placed under the buried photodiode. Since the collectors of the transistors of the various pixels share the same voltage, they may be merged into one. The buried collector 170 may be biased for all the pixels via a surface contact and a sufficiently deep N-doped well (not shown in FIG. 25) passing through the P-doped first substrate 169.

Figure 26:
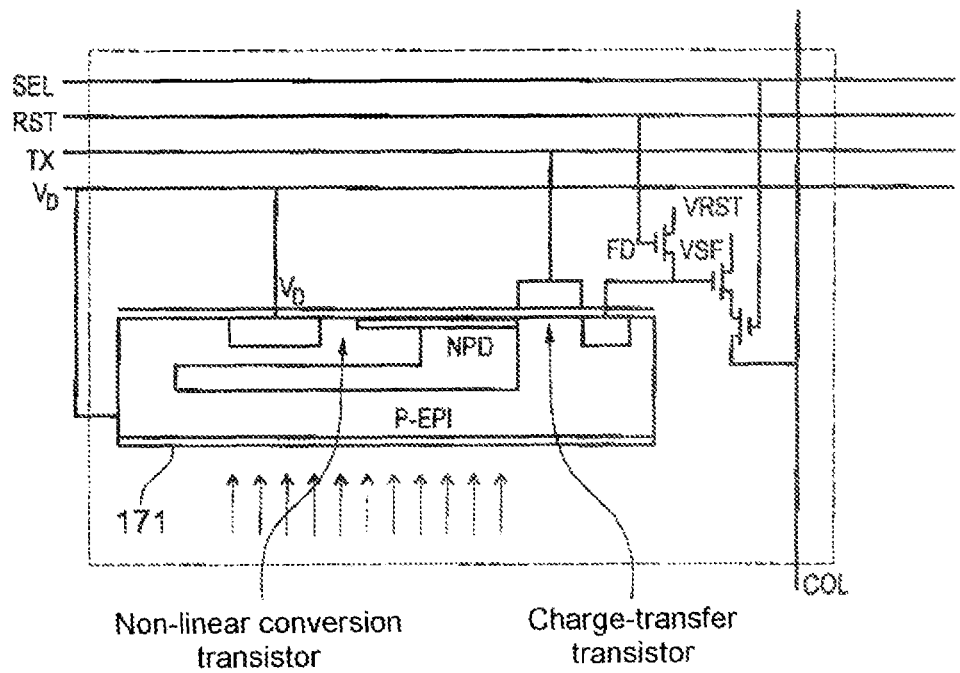

The embodiment illustrated in FIG. 26 has a configuration that is suitable for a backside-illuminated pixel 171. The conversion transistor is a bipolar transistor, the base of which is connected to the substrate, which forms the anode of the photodiode, and the temperature compensation is achieved via the DIBL effect between the collector and the buried photodiode (the de facto emitter of this transistor).

Figure 27:
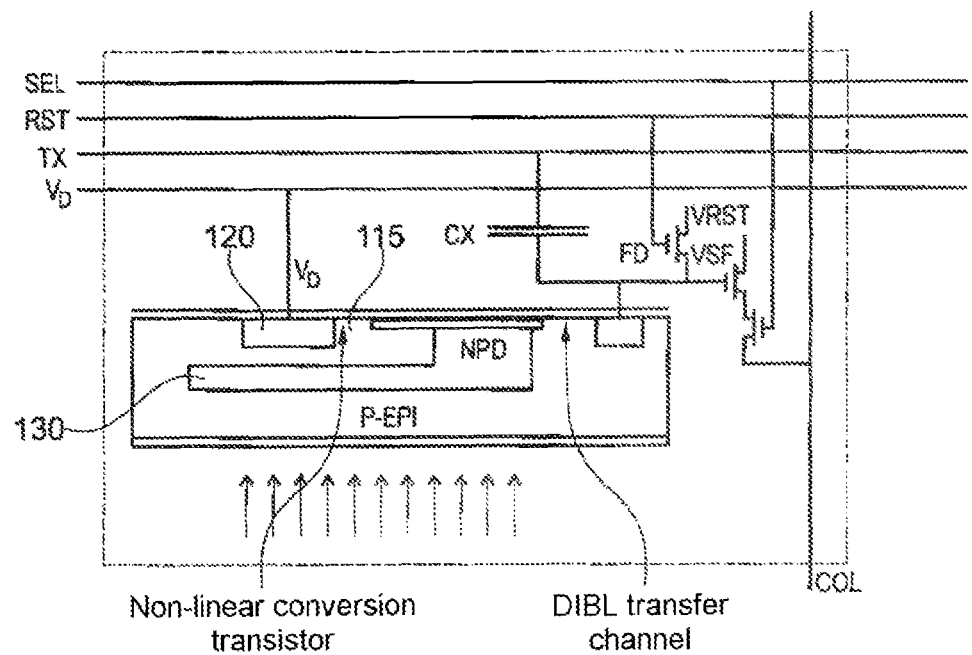

In the embodiment illustrated in FIG. 27, the transfer transistor is a BJT or virtual-gate MOS transistor, the gate voltage of which is that of the substrate. The DIBL effect is exploited to extract the charge stored in the photodiode. A capacitor CX is connected between the signal TX controlling transfer and the capacitive node FD. After the capacitive node FD has been reset, the signal TX passes to a higher level. This overvoltage is transmitted to the capacitive node FD via the capacitor CX and causes a current to pass via the extreme DIBL effect referred to as punch through (or PT). This current allows the charge to be transferred from the buried photodiode to the capacitor CX. In this figure, the photodiode is illuminated from the back side, and the doped region forming the cathode of the photodiode is extended by a region 130 under the drain 120 of the conversion transistor. The doped surface region, of $P^+$-type in the case of a P-type substrate, is also extended by 115 above the region 130 toward the drain 120, in order to eliminate surface leakage current.

The advantage is that the transfer by punch through occurs in the bulk of the silicon and therefore the $P^+$ layer may better cover the cathode of the buried photodiode. This further decreases dark current. The fabrication process may possibly be simpler.

Figure 1:
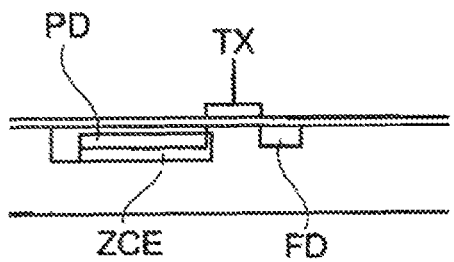
Figure 2:
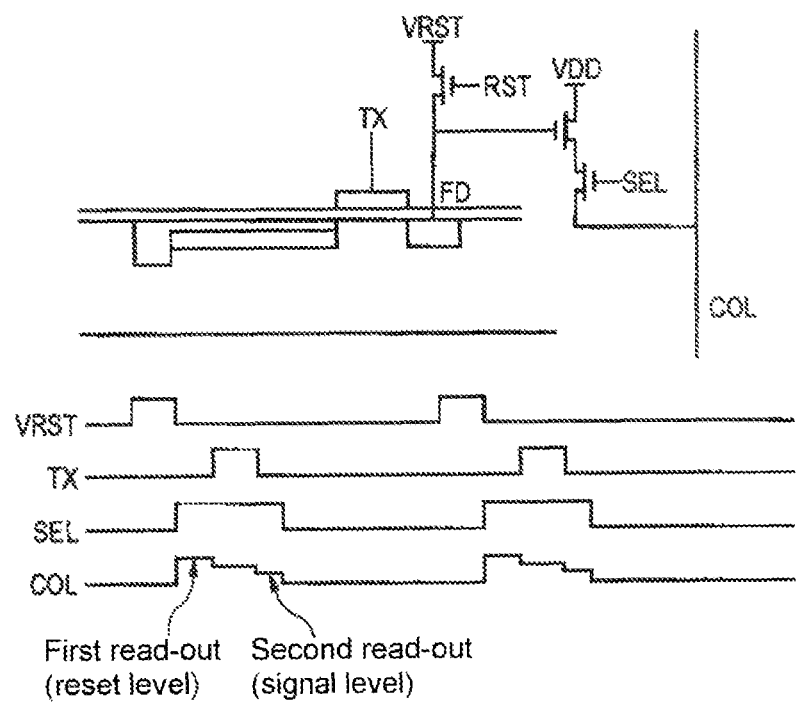
Figure 3:
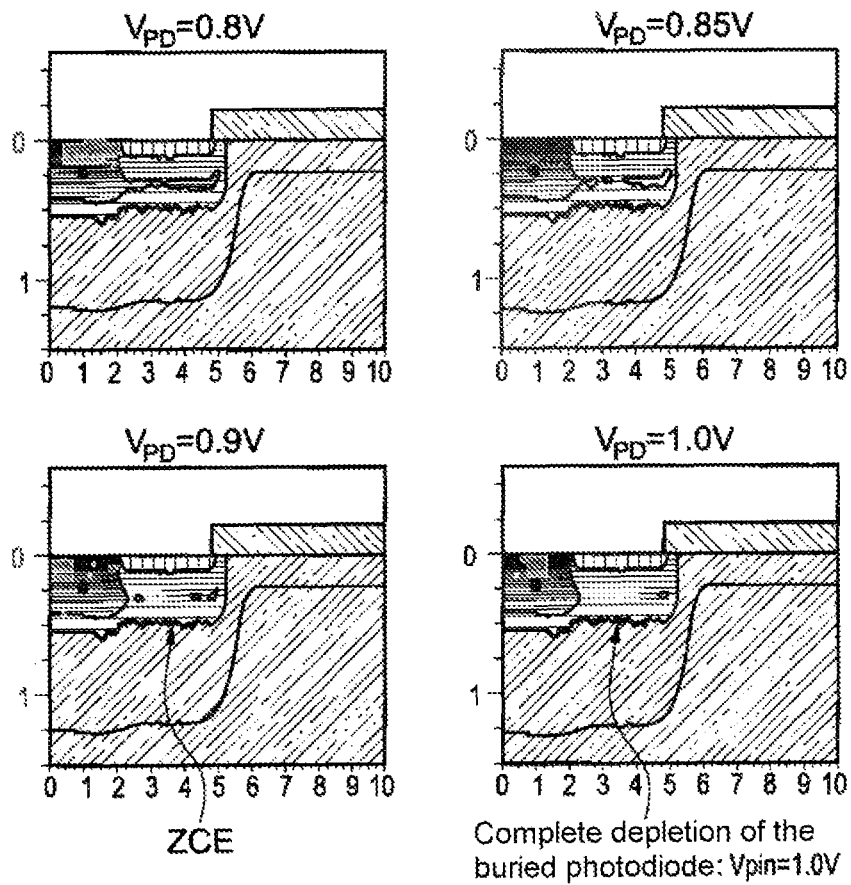
Figure 4:
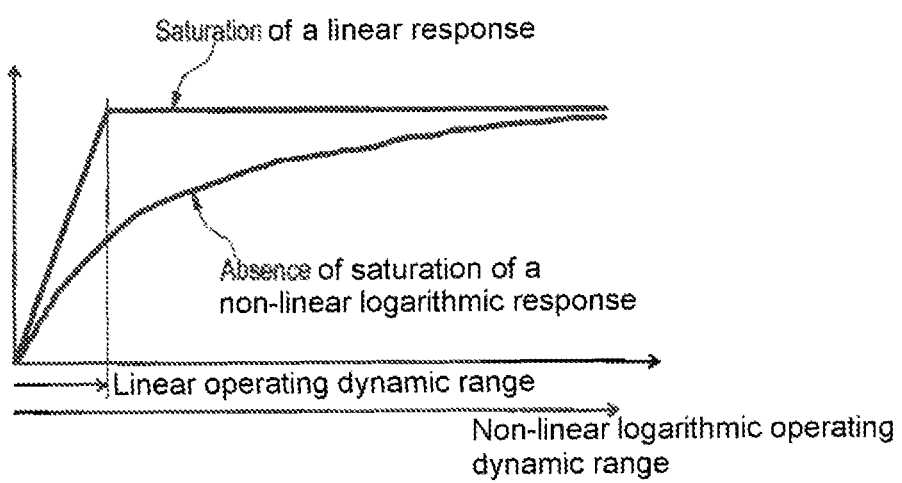
Figure 28:
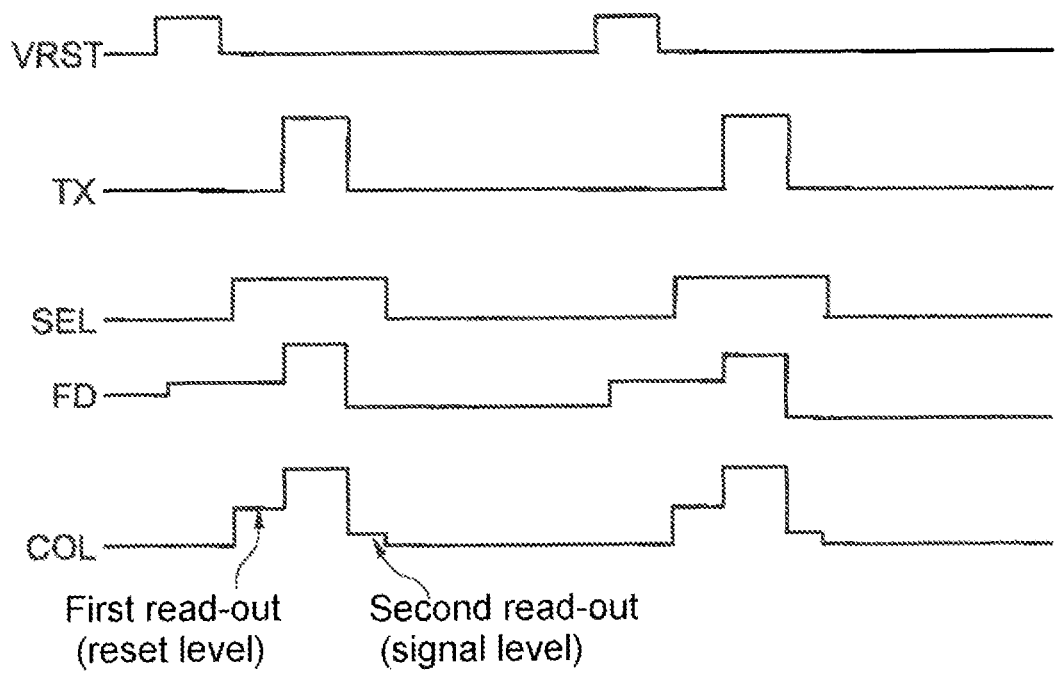
FIG. 28 is a pixel read-out timing diagram.

In all these embodiments, the read out is carried out in the same way as for a conventional 4T pixel, the timing diagram of the signals of which is illustrated in FIG. 2. FIG. 28 gives an operating timing diagram applicable to all the embodiments.

Figure 29:
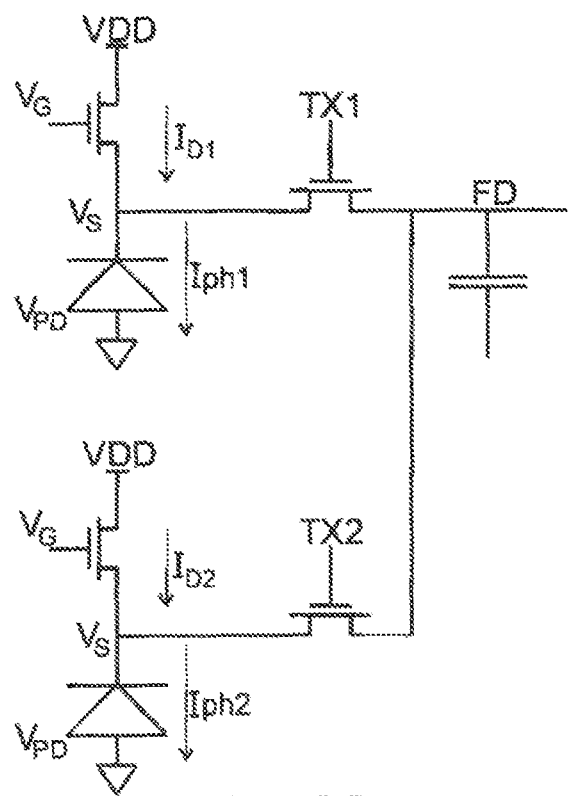
FIG. 29 illustrates that it is possible to associate a plurality of photodiodes with the same capacitive node.

The compactness of the embodiments described above may be increased by merging the capacitive node FD and the transistors involved in the read-out of the voltage of the capacitive node FD. In this case, a plurality of buried photodiodes associated with their non-linear conversion element may be connected to the same capacitive node FD via respective transfer transistors, as illustrated in FIG. 29. These various photodiodes may be read sequentially, one after the other, with the control timing diagram of FIG. 2. This compacting technique is commonly used in small-pitch image sensors.

The invention is not limited to the examples just described. In particular, the N and P carrier types may be inverted, a P-type substrate becoming an N-type substrate, an N-doped well becoming a P-doped well and vice versa.

Various modifications may be made to the structures described. For example, the embodiment of FIG. 24 may have no doped confinement well under the non-linear conversion transistor and the transfer transistor.

The invention claimed is:

1. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a MOS transistor, the one or more control signals being applied to the gate and/or to the drain of the transistor, the sensor including a doped confinement well under a drain/collector region of the transistor.

2. The sensor as claimed in claim 1, the conversion element being a bipolar transistor, the control signal being applied to the collector of the transistor.

3. The sensor as claimed in claim 1, said at least one control signal being dependent on temperature.

4. The sensor as claimed in claim 1, including at least one reference pixel having the same structure as the one or more illuminated pixels, this reference pixel being protected from an incident light and receiving an injection of charge simulating an illumination condition.

5. The sensor as claimed in claim 1, the charge-transfer element being a MOS transistor.

6. The sensor as claimed in claim 1, the charge-transfer element being a bipolar transistor.

7. The sensor as claimed in claim 1, the control signal being the collector or drain voltage.

8. A method for compensating for the temperature of a sensor as claimed in claim 1, comprising the step of acting on said at least one control signal in order to compensate for the influence of the temperature on the leakage of photoelectric charge from the photodiode.

9. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a MOS transistor, the one or more control signals being applied to the gate and/or to the drain of the transistor, the drain/collector of the transistor being formed by a doped well having a depth larger than or equal to that of read transistors of the pixel.

10. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a MOS transistor, the one or more control signals being applied to the gate and/or to the drain of the transistor, the conversion element including a buried collector or drain, common to a plurality of pixels of the sensor.

11. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a MOS transistor, the one or more control signals being applied to the gate and/or to the drain of the transistor, a doped region corresponding to the cathode of the photodiode extending below a doped region corresponding to the drain/collector of the transistor.

12. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a MOS transistor, the one or more control signals being applied to the gate and/or to the drain of the transistor, a doped region corresponding to the cathode of the photodiode extending below a doped region corresponding to the drain/collector of the transistor, the photodiode being illuminated via a back side of a substrate.

13. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the sensor including at least one reference pixel having the same structure as the one or more illuminated pixels, this reference pixel being protected from an incident light and receiving an injection of charge simulating an illumination condition, said at least one control signal being controlled automatically depending on the signal output from the reference pixel or a group of reference pixels, in order to maintain the output signal of the reference pixel or of this group of reference pixels at a constant value.

14. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the charge-transfer element including drain-induced-barrier-lowering means.

15. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the charge-transfer element including collector-induced-barrier-lowering means.

16. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a virtual base or gate transistor the potential of which is set to that of a substrate.

17. An optical sensor that includes one or more charge-transfer pixels each including a buried photodiode generating a photoelectric charge under illumination, a conversion element having a non-linear conductivity dependent on at least one control signal that is applied thereto, receiving at least some of this photoelectric charge and impressing on the photodiode a potential respecting a non-linear relationship with the intensity generating the photoelectric charge so that the non-linear relationship corresponds to a linear progression at low light levels then a logarithmic progression at higher light levels, and a charge-transfer element for reading the charge stored in the photodiode such that the residual charge in the photodiode is zero after the read-out by transfer, the conversion element being a bipolar transistor, the control signal being applied to the collector of the transistor, an emitter of the bipolar transistor formed by a doped region corresponding to the cathode of the photodiode and a base of the bipolar transistor corresponding to the anode substrate of the photodiode.

* * * * *